(12) United States Patent
Du

(10) Patent No.: US 9,374,110 B2
(45) Date of Patent: Jun. 21, 2016

(54) MULTIMODE DECODER IMPLEMENTATION METHOD AND DEVICE

(71) Applicant: ZTE CORPORATION, Shenzhen, Guangdong Province (CN)

(72) Inventor: Jinzhou Du, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 14/655,732

(22) PCT Filed: Oct. 25, 2013

(86) PCT No.: PCT/CN2013/085969
§ 371 (c)(1),
(2) Date: Jul. 21, 2015

(87) PCT Pub. No.: WO2014/101562
PCT Pub. Date: Jul. 3, 2014

(65) Prior Publication Data
US 2015/0381211 A1      Dec. 31, 2015

(30) Foreign Application Priority Data

Dec. 27, 2012  (CN) .......................... 2012 1 0580654

(51) Int. Cl.
*H03M 13/27*  (2006.01)
*H03M 13/00*  (2006.01)
(Continued)

(52) U.S. Cl.
CPC ...... *H03M 13/6525* (2013.01); *H03M 13/2957* (2013.01); *H03M 13/395* (2013.01); *H03M 13/3905* (2013.01); *H03M 13/6519* (2013.01); *H03M 13/6544* (2013.01); *H04L 1/005* (2013.01); *H04L 1/0055* (2013.01); *H04L 1/0066* (2013.01); *H04L 1/0071* (2013.01)

(58) Field of Classification Search
CPC .............................. H03M 13/27; H03M 13/29
See application file for complete search history.

(56) References Cited

U.S. PATENT DOCUMENTS

| | | | | |
|---|---|---|---|---|
| 2008/0123781 A1* | 5/2008 | Pisek | ................ | H03M 13/2969 375/340 |
| 2010/0287343 A1* | 11/2010 | Neeman | ............ | H03M 13/2714 711/157 |

(Continued)

FOREIGN PATENT DOCUMENTS

| CN | 102355331 A | 2/2012 |
|---|---|---|
| CN | 102412850 A | 4/2012 |

OTHER PUBLICATIONS

Sun et al, "Efficient hardware implementation of a highly-parallel 3GPP LTE/LTE-advance turbo decoder," Integration, the VLSI Journal, vol. 44, No. 4, Sep. 2011.*

(Continued)

*Primary Examiner* — Jaison Joseph
(74) *Attorney, Agent, or Firm* — Ling Wu; Stephen Yang; Ling and Yang Intellectual Property

(57) ABSTRACT

Disclosed are a multimode decoder method and device. The method includes: interleaving pre-stored to-be-decoded data to obtain an interleaving address; and based on the interleaving address, using a Radix-4 algorithm architecture, multiplexing a set of MAP decoding units under different standards, and in a parallel processing method, performing MAP iterative decoding processing on the to-be-decoded data according to standard types.

8 Claims, 9 Drawing Sheets

(51) Int. Cl.
  *H03M 13/39* (2006.01)
  *H04L 1/00* (2006.01)
  *H03M 13/29* (2006.01)

(56) References Cited

U.S. PATENT DOCUMENTS

2012/0128102 A1  5/2012  Sokolov et al.
2012/0134325 A1  5/2012  Panteleev et al.
2012/0166742 A1*  6/2012  Wang ............... H03M 13/2957
                                                    711/154

OTHER PUBLICATIONS

J.W. W Jung et al., "Design and Architecture of Low-Latency High-Speed Turbo Decoder," ETRI Journal, vol. 27, No. 5, Oct. 2005, pp. 525-532.*

Flexible Interleaving Sub-systems for FEC in Baseband Processors; Rizwan Asghar ; Linköping Studies in Science and Technology; Dissertation No. 1312; ISSN 0345-7524; Computer Engineering ; Department of Electrical Engineering; Linköping University, SE-581 83, Linköping,Sweden.

Configurable and Scalable High Throughput Turbo Decoder Architecture for Multiple 4GWireless Standards; Yang Sun et al. ECE Department, Rice University; XP031292402.

A Unified Parallel Radix-4 Turbo Decoder for Moblie WiMAX and 3GPP-LTE; Ji-Hoon Kim et al. Korea, IEEE 2009 Custom Intergrated Circuits Conference (CICC); XP031542638.

A 1.06nj/bit/iteration 3.38mm$^2$ Turbo Decoder Chip for WiMAX/LTS Standards; Cheng-Hung Lin et al. Taiwan.

* cited by examiner

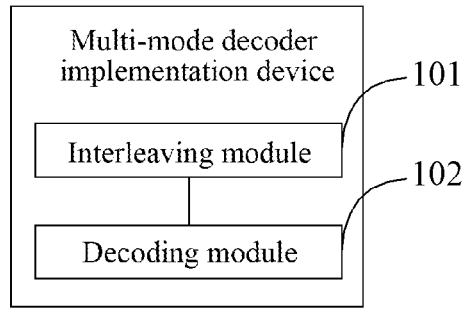
FIG. 9
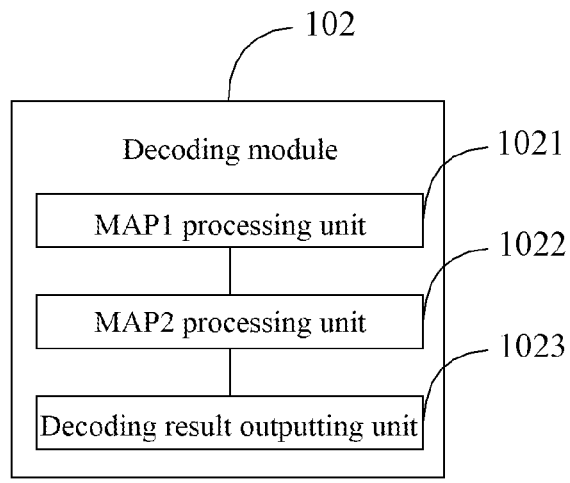
FIG. 10
FIG. 11

MULTIMODE DECODER IMPLEMENTATION METHOD AND DEVICE

TECHNICAL FIELD

The present document relates to the field of mobile communication technologies, and more particularly, to a method and device for implementing a multimode decoder which supports standards such as LTE (Long Term Evolution), UMTS (Universal Mobile Telecommunications System), TD-SCDMA (TimeDivision-Synchronous Code Division Multiple Access) and WiMAX (Worldwide Interoperability for Microwave Access).

BACKGROUND OF THE RELATED ART

Currently, in a wireless communication system, with the evolution from the 3rd Generation (3G) to the 4th Generation (4G), there are four communication standards: UMTS, TD-SCDMA, WiMAX and LTE. In order to be compatible with these standards, the common mode of multi-standard needs to be implemented at the system side of the wireless communication system. However, because the procedures of processing these four standards vary widely, only modules with similar processing procedures and a relatively large consumption of resources can be shared. Wherein a typical processor is the Turbo decoder.

Turbo code has an extremely wide range of applications in the wireless communication system because its decoding performance is near to the Shannon limit. Wireless communication standards such as LTE, UMTS, TD-SCDMA, and WiMAX consider the Turbo code as their channel encoding and decoding methods.

Through constant iterations, the Turbo decoder can achieve the Log Maximum A Posterior (Log-MAP) algorithm or the Maximum Log Maximum A Posterior (Max-Log-MAP) decoding algorithm. Its hardware implementation has a high complexity and a big resource consumption, especially in situations where a variety of standards coexist, and developing a Turbo decoder that is compatible with a variety of standards but has small resources consumption has great significance.

Currently, the Turbo decoding methods of different standards are similar in term of the algorithm and all of them use the MAP algorithm, which is conducive to being compatible with the Turbo decoder. But the hardware implementation is quite different.

First, the coding modes are very different, especially the WiMAX, each of its component codes uses the two-bit coding mode, which determines that its decoding must use a MAP algorithm (take one bit pair as the processing unit) with the Radix-4 or above. The 3GPP standard (LTE, UMTS, TD-SCDMA) decoding can use the MAP algorithm (take the bit as the basic processing unit) with the Radix-2.

Second, the tail-bit processing methods are different. The WiMAX Turbo code (also called as Convolutional Code (CTC)) uses the tail-biting raster termination method. During the decoding, there is no tail bit processing. For the 3GPP-standard Turbo code, the tail bit is used for the raster termination. During the decoding, the tail bit is processed differently according to the standards.

Third, the interleaving modes are different. The interleaving modes are different in different standards. More importantly, the interleaving mode decides whether it can perform parallel decoding in the hardware implementation or not. The LTE and WiMAX interleaving modes can support the parallel decoding, while the UMTS and TD-SCDMA interleaving mode cannot support it.

Finally, the sizes of code blocks of different standards are different. The lengths of the LTE and WiMAX code blocks are even numbers; the sizes of the UMTS and TD-SCDMA code blocks can be any values between 40 and 5114. Because there are tail bits, when the sizes of code block are odd and even numbers respectively, their algorithm processings are different.

Under the same conditions (mainly the clock frequency, the length of code block and the number of parallel channels), the delay of the MAP algorithm with Radix-4 is half of that of the one with Radix-2, as shown in FIG. 1, and FIG. 1 is the state transition diagram of a conventional 3GPP Turbo Decoder when using the Radix-2. Considering from the level of algorithm, the LTE, UMTS and TD-SCDMA can use the Radix-4 MAP algorithm architecture, but it will bring hardware complexity and feasibility. For example, when the calculation of collision occurs simultaneously in the Alpha (alpha) and Beta (beta) in each window, if using the Radix-4 algorithm architecture, it needs to read 4 data from the random access memory (RAM) and calculate them (if using the Radix-2 algorithm architecture, the number of data that need to be read and calculated is 2).

Considering from the ease of implementation, for the standards of LTE, UMTS, and TD-SCDMA, when using the conventional Radix-2 algorithm architecture, the hardware implementation can be much easier, but it is not conducive to being compatible with the WiMAX (since the WiMAX only uses the Radix-4). If using two sets of Max-Log-MAP units, wherein one is processing the Radix-2 (for the 3GPP), and the other is processing the Radix-4 (for the WiMAX), although the implementation is simple, the resource utilization rate is not high and the resource consumption is also high, thus losing the significance of designing the multi-mode decoder.

Therefore, the existing Turbo decoder cannot solve the problem of resource sharing among different standards.

SUMMARY OF THE INVENTION

The embodiment of the present invention provide a method and device for implementing a multi-mode decoder which can be compatible with multiple standards such as LTE, UMTS, TD-SCDMA and WiMAX to solve the problem of resources sharing in different standards.

The embodiment of the present invention provides a multi-mode decoder implementation method, comprising:

performing an interleaving processing on pre-stored and to-be-decoded data to obtain an interleaving address; and based on the interleaving address, using a Radix-4 algorithm architecture, multiplexing a set of maximum a posterior (MAP) decoding units in different standards, and using a parallel processing method to perform a MAP iterative decoding processing on the to-be-decoded data in accordance with standard types.

Alternatively, said based on the interleaving address, using the Radix-4 algorithm architecture, multiplexing a set of MAP decoding units in different standards, and using a parallel processing method to perform a MAP iterative decoding processing on the to-be-decoded data in accordance with standard types comprises:

using a Radix-4 algorithm architecture, multiplexing a set of MAP decoding units, using a parallel processing method, and performing a MAP1 processing on the to-be-decoded data in accordance with the standard types;

based on the interleaving address, using the Radix-4 algorithm architecture, multiplexing a set of MAP decoding units, using a parallel processing method, and performing a MAP2 processing on the to-be-decoded data in accordance with the standard types; and after meeting an iteration termination condition, terminating MAP iterations and outputting a decoding result.

Alternatively, the set of MAP decoding units comprises four MAP decoding units;

said using the Radix-4 algorithm architecture, multiplexing a set of MAP decoding units, using a parallel processing method, and performing a MAP1 processing on the to-be-decoded data in accordance with the standard types comprises:

in a Long Term Evolution (LTE) standard and Worldwide Interoperability for Microwave Access (WiMAX) standard, using four MAP decoding units for parallel processing, and using a forward Alpha and backward Beta collision computing method, before a collision, while reading priori information to perform a MAP calculation, sequentially buffering priori information of a sliding window length; after a collision, reading the priori information from a buffer for calculation, and saving priori information obtained from calculation into a priori information storage random access memory (RAM); and in a Universal Mobile Telecommunications System (UMTS) standard and time division-synchronous code division multiple address (TD-SCDMA) standard, when calculating Gamma, backing up system information at the same time.

Alternatively, the set of MAP decoding units comprises four MAP decoding units;

said using the Radix-4 algorithm architecture and multiplexing a MAP decoding unit based on the interleaving address, and using a parallel processing method and performing a MAP2 processing on the to-be-decoded data in accordance with the standard types comprises:

in a LTE standard and WiMAX standard, based on the interleaving address, using four MAP decoding units for parallel processing, and using a forward Alpha and backward Beta collision computing method, before a collision, while reading priori information to perform a MAP calculation, sequentially buffering priori information of a sliding window length; after a collision, reading the priori information from a buffer for calculation, and saving priori information obtained from calculation into a priori information storage random access memory (RAM); and in a UMTS mode and TD-SCDMA standard, when performing a Alpha and Beta collision calculation, simultaneously reading 4 system bits/check bit 2/priori information from a storage RAM; and saving the 4 priori information/hard judgments obtained from the collision calculation into the storage RAM at the same time.

Alternatively, the method further comprises:

Before performing an interleaving processing on the pre-stored to-be-decoded data to obtain an interleaving address, storing the to-be-decoded data according to a predetermined method;

said storing the to-be-decoded data according to a predetermined method comprises:

in a LTE standard, respectively saving input to-be-decoded data into four groups of RAMs with a depth of 1536 according to processing units (PUs) where the to-be-decoded data are located; wherein each group of RAMs with a depth of 1536 is composed of two RAMs with a depth of 768, which respectively store the to-be-decoded data of each PU according to even and odd addresses of each group;

in a UMTS standard and TD-SCDMA standard, for input to-be-decoded data, according to even and odd addresses of each group, in accordance with the length of code block, using a storing method of a group of RAMs with a depth of 1536 being filled up and then a next group of RAMs with a depth of 1536 being filled, wherein each group of RAMs with a depth of 1536 is composed of two RAMs with a depth of 768, wherein one RAM with a depth of 768 corresponds to data with the odd address, and the other RAM with a depth of 768 corresponds to data with the even address; and in a WiMAX standard, saving 600 bit pairs corresponding to A/B of each channel of to-be-decoded data into two RAMs with a depth of 768 within the RAM with a depth of 1536, saving 600 bit pairs corresponding to Y of each channel of to-be-decoded data into two RAMs with a depth of 768 within the RAM with a depth of 1536, and saving 600 bit pairs corresponding to W of each channel of to-be-decoded data into two RAM with a depth of 768 within the RAM with a depth of 1536.

The embodiment of the present invention further provides a multimode decoder implementation device, comprising:

an interleaving module, which is configured to: perform an interleaving processing on pre-stored to-be-decoded data to obtain an interleaving address; and a decoding module, which is configured to: based on the interleaving address, use a Radix-4 algorithm architecture, multiplex a set of maximum a posterior (MAP) decoding units in different standards, use a parallel processing method and perform a MAP iterative decoding processing on the to-be-decoded data according to standard types.

Alternatively, the decoding module comprises:

a MAP1 processing unit, which is configured to: use a Radix-4 algorithm architecture, multiplex a set of MAP decoding units, use a parallel processing method, and perform a MAP1 processing on to-be-decoded data in accordance with standard types;

a MAP2 processing unit, which is configured to: based on the interleaving address, use a Radix-4 algorithm architecture, multiplex a set of MAP decoding units, use a parallel processing method, and perform a MAP2 processing on the to-be-decoded data in accordance with the standard types; and a decoding result outputting unit, which is configured to: after meeting an iteration termination condition, terminate MAP iteration and output a decoding result.

Alternatively, the set of MAP decoding units comprises four MAP decoding units;

the MAP1 processing unit is configured to use the Radix-4 algorithm architecture, multiplex a set of MAP decoding units, use a parallel processing method and perform a MAP1 processing on the to-be-decoded data in accordance with the standard types in a following way:

in a Long Term Evolution (LTE) standard and Worldwide Interoperability for Microwave Access (WiMAX) standard, using four MAP decoding units for parallel processing, and using a forward Alpha and backward Beta collision computing method, before a collision, while reading priori information to perform a MAP calculation, sequentially buffering priori information of a sliding window length; after a collision, reading priori information from a buffer for calculation, and saving priori information obtained from calculation into a priori information storage random access memory (RAM); and in a Universal Mobile Telecommunications System (UMTS) standard and time division-synchronous code division multiple address (TD-SCDMA) standard, when calculating Gamma, backing up system information at the same time.

Alternatively, the set of MAP decoding unit comprises four MAP decoding units;

the MAP2 processing unit is configured to: based on the interleaving address, use the Radix-4 algorithm architecture, multiplex a set of MAP decoding units, use a parallel processing method, and perform a MAP2 processing on the to-be-decoded data in accordance with the standard types in a following way:

in a LTE standard and WiMAX standard, based on the interleaving address, using four MAP decoding units for parallel processing, and using a forward Alpha and backward Beta collision computing method, before a collision, while reading priori information to perform the MAP calculation, sequentially buffering the priori information of a sliding window length; after a collision, reading the priori information from the buffer for calculation, and saving the priori information obtained from calculation into a priori information storage random access memory (RAM); and in a UMTS standard and TD-SCDMA standard, when performing a Alpha and Beta collision calculation, simultaneously reading 4 system bits/check bit 2/priori information from a storage RAM; and saving the 4 priori information/hard judgments obtained from the collision calculation into the storage RAM at the same time.

Alternatively, the device further comprises:

a storing module, which is configured to store the to-be-decoded data according to a predetermined method;

wherein the storing module is configured to store the to-be-decoded data according to a predetermined method in a following way:

in the LTE standard, respectively saving the input to-be-decoded data in four groups of RAMs with a depth of 1536 in accordance with processing units (PUs) where the to-be-decoded data are located; wherein each group of RAMs with a depth of 1536 is composed of two RAMs with a depth of 768, and respectively saving the to-be-decoded data of each PU according to even and odd addresses of each group;

in the UMTS standard and TD-SCDMA standard, for the input to-be-decoded data, according to the even and odd addresses of each group, in accordance with the length of code block, using a storing method of one group of RAMs with a depth of 1536 being filled up and then a next group of RAMs with a depth of 1536 being filled, wherein each group of RAMs with a depth of 1536 is composed of two RAMs with a depth of 768, wherein one RAM with a depth of 768 corresponds to data with the odd address, and the other RAM with a depth of 768 corresponds to data with the even address; and in the WiMAX standard, saving 600 bit pairs corresponding to A/B of each channel of to-be-decoded data into two RAMs with a depth of 768 within a RAM with a depth of 1536, saving 600 bit pairs corresponding to Y of each channel of to-be-decoded data into two RAMs with a depth of 768 within a RAM with a depth of 1536, saving 600 bit pairs corresponding to W of each channel of to-be-decoded data into two RAMs with a depth of 768 within a RAM with a depth of 1536.

The multi-mode decoder implementation method and device provided in the embodiment of the present invention are used to effectively integrate and multiplex resources, which can be compatible with standards such as LTE, UMTS, TD-SCDMA, and WiMAX, thus making the system design more reasonable, and significantly saving the system logic resources; and greatly cutting some unnecessary RAM resources in different standards through multiplexing the RAM reasonably.

BRIEF DESCRIPTION OF THE DRAWINGS

FIG. 9 is a schematic diagram of a WiMAX input data buffer format in the multi-mode decoder implementation method in accordance with another embodiment of the present invention;

FIG. 10 is a schematic diagram of the structure of a multi-mode decoder implementation device in accordance with an embodiment of the present invention;

FIG. 11 is a schematic diagram of the structure of a decoding module in the multimode decoder implementation device in accordance with an embodiment of the present invention;

PREFERRED EMBODIMENTS OF THE INVENTION

The solution according to the embodiment of the present invention is mainly: using the Radix-4 algorithm architecture, multiplexing a set of MAP decoding units, using a parallel processing method, performing a MAP iterative decoding processing on the to-be-decoded data in accordance with the standard types, effectively integrating and multiplexing the resources, so as to be compatible with a variety of standards such as LTE, UMTS, TD-SCDMA and WiMAX, and make the system design more rational and the system resources more optimized.

Figure 1:
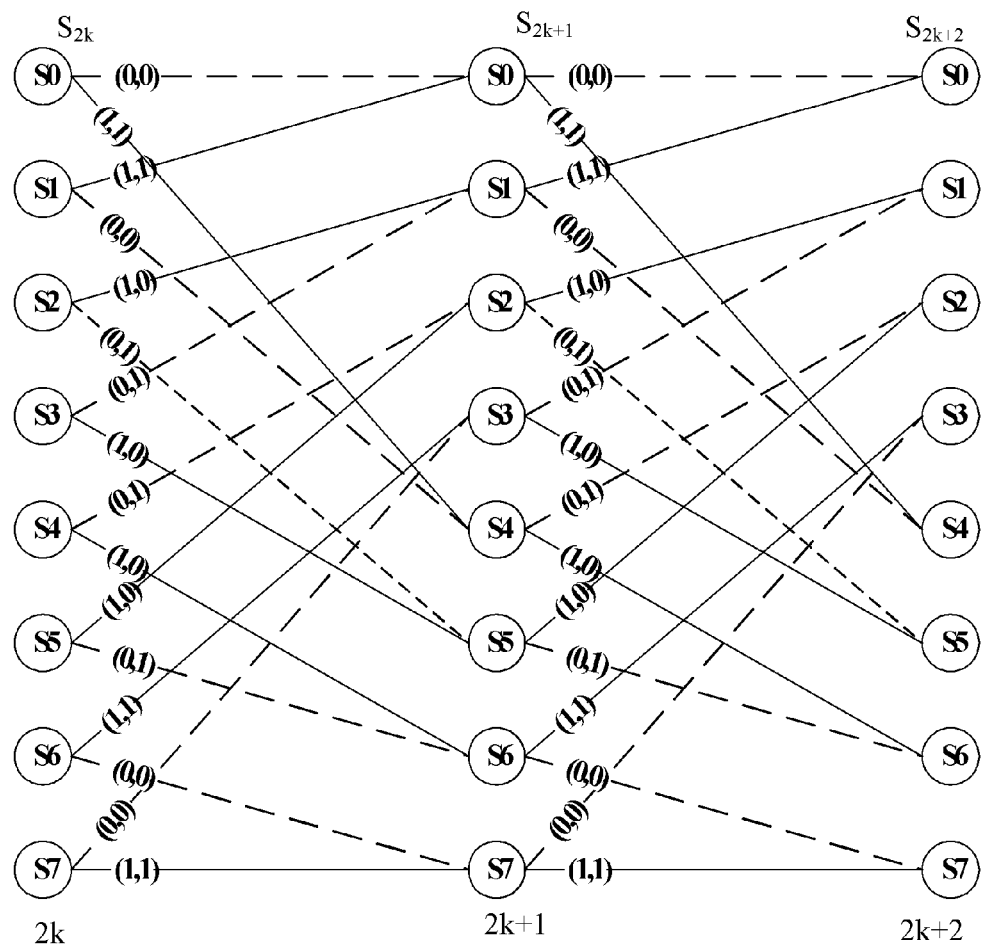
FIG. 1 is the state transition diagram of an existing 3GPP Turbo Decoder when using the Radix-2.
Figure 2:
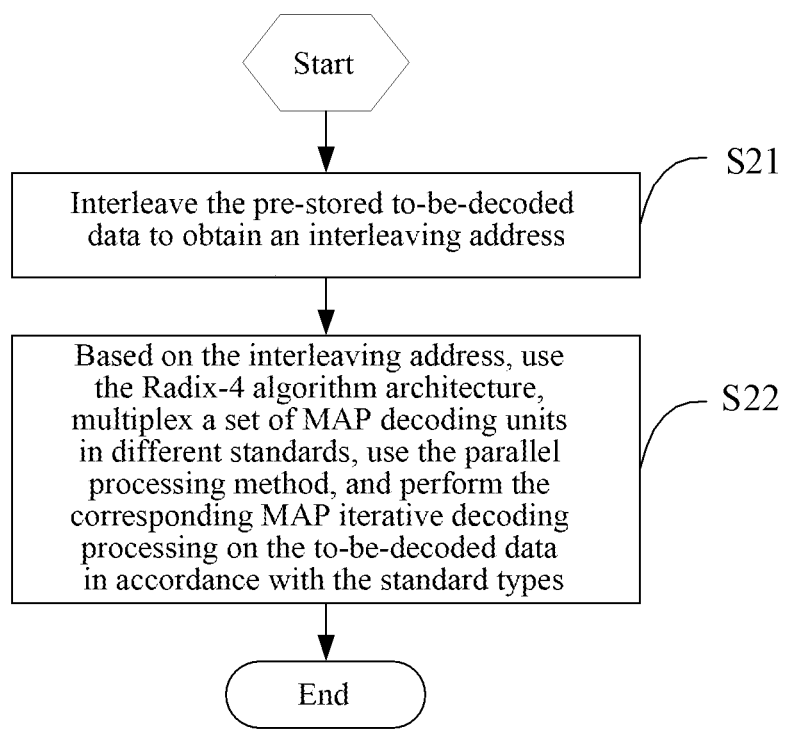
FIG. 2 is a flow chart of a multi-mode decoder implementation method in accordance with an embodiment of the present invention.

As shown in FIG. 2, a multi-mode decoder implementation method provided in one embodiment of the present invention comprises the following steps:

in step S21, it is to perform an interleaving processing on the pre-stored to-be-decoded data to obtain an interleaving address.

The multi-mode decoder in the present embodiment is a Turbo decoder which is compatible with a variety of standards such as LTE, UMTS, TD-SCDMA and WiMAX, so as to solve the problem of resources sharing in different standards.

Figure 3:
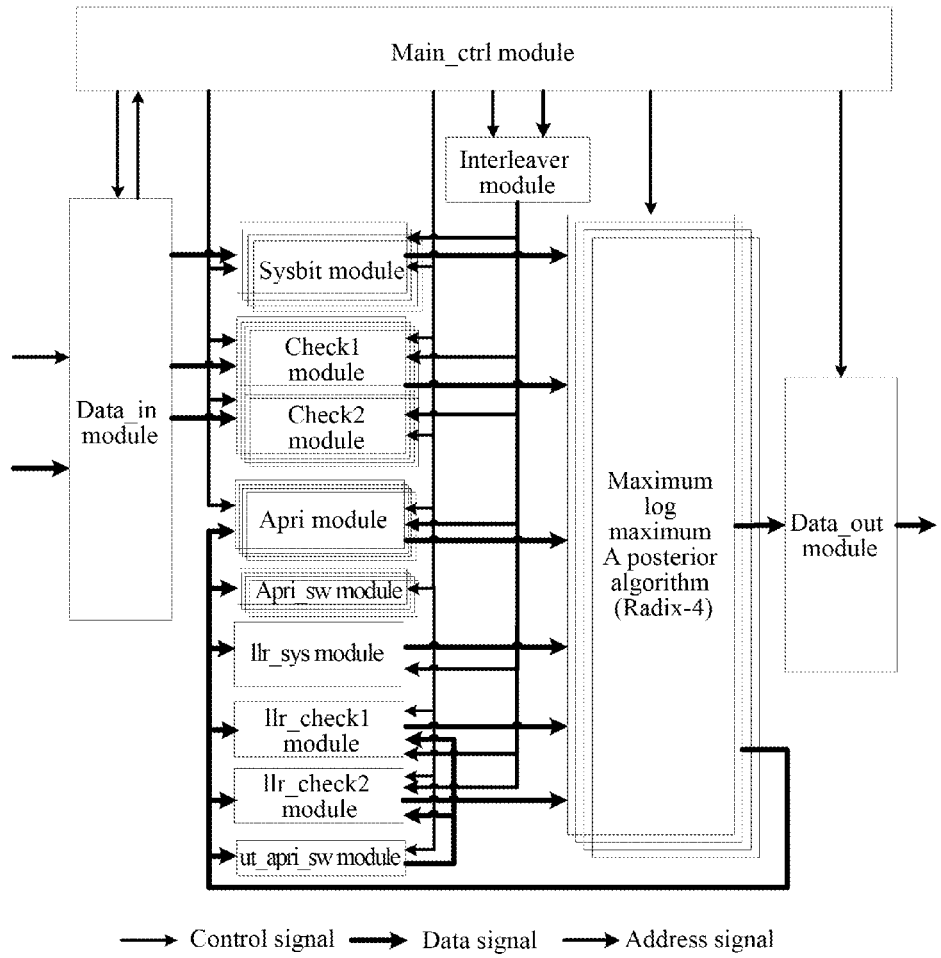
FIG. 3 is a system block diagram involved in the multi-mode decoder implementation method in accordance with an embodiment of the present invention.

The processing system block diagram according to the embodiment of the present invention is shown in FIG. 3. Wherein:

a data_in module is responsible for shaking hands with external modules, receiving decoding parameters, and dividing the decoded data into several channels according to certain requirements.

An interleaver module is responsible for computing interleaving addresses of several standards. A max_log_map module is responsible for completing the Radix-4 MAP algorithm.

A data_out module, according to specific requirements, is responsible for outputting hard judgment data and soft information (when the LTE supports the Turbo-SIC scene).

A main_ctrl module is responsible for controlling the decoders in different standards to ensure that the decoders complete the MAP algorithm according to their own processing procedures.

A sysbit/check1/check2 module stores the information bits of each PU respectively according to the method for storing information bits with the even and odd addresses separately.

An priori information (apri) module is responsible for storing the apri in the LTE and WiMAX (there is no apri_11 in the WiMAX); in the UMTS and TD-SCDMA, this part is used to store the priori information obtained from the MAP2 calculation.

A priori information backup within the window (apri_sw) module is used for backing up the priori information of one window length before the Alpha and Beta collision in each window in the LTE and WiMAX standards.

A system maximum likelihood ratio (llr_sys) module stores the output system log-likelihood ratio (LLR) in the LTE; in the WiMAX, stores the apri_11 obtained from each MAP (including MAP1 and MAP2) calculation and the apri_11 of each window; in the UMTS and the TD-SCDMA, backs up the entire system bits.

A llr_check1 module stores the output LLR of the check1 in the LTE; and it is responsible for backing up a copy of the priori information obtained from the MAP1 calculation in the UMTS or the TD-SCDMA.

A llr_check2 module stores the output LLR of the check 2 in the LTE; and it is responsible for backing up a copy of the priori information obtained from the MAP1 calculation in the UMTS or the TD-SCDMA.

A buffer (ut_apri_sw) module is used for backing up the priori information, hard judgment result and interleaving address of one window before the Alpha and Beta collision of the MAP2 in the UMTS and the TD-SCDMA.

Next, the steps of processing the Radix-4 multi-mode Turbo decoder are described in detail.

In the LTE standard, take the maximum code block of 6144 being divided into four PUs and each PU being divided into four 192 window serial processing as an example; in the UMTS and TD-SCDMA standards, take the maximum code blocks of 5114 using 128 as the maximum window serial processing for example; in the WiMAX standard, take the maximum Forward Error Correction (FEC) block of 4800 being divided into four PUs and each PU being divided into four 150 window serial processing for example.

The method in accordance with the embodiment of the present invention comprises performing iteration on the to-be-decoded data several times, and each iteration comprises MAP1 and MAP2 processing procedures, and the MAP1 input data is based on the sequential address, the MAP2 input data is based on the interleaving address. The process of interleaving the to-be-decoded data in the embodiment of the present invention is to provide the interleaving address for the MAP2 processing. Wherein, the interleaving process may be performed at the same time of the MAP1 processing, or before or after the MAP1 processing, and the present embodiment takes calculating the interleaving address before the MAP1 processing as an example.

First, it is to perform the interleaving calculation on the to-be-decoded data previously stored in a particular way to obtain an interleaving address.

During the data storage, the data are stored according to a certain method, for example, for the LTE and WiMAX standards, various PUs are stored independently, and in each PU, data with the even and odd addresses are also stored separately; for the UMTS and TD-SCDMA standards, only the data with the even and odd addresses are stored separately. The first group of RAMs is filled up first, and then the next group of RAM is filled.

When calculating the interleaving address, the interleaving address is calculated according to the original addresses of the two input bit pairs (corresponding to four original addresses in the 3GPP standard). The interleaving units of different standards are different, but the external interfaces of the modules are the same.

In step S22, based on the interleaving address, it is to use the Radix-4 algorithm architecture, multiplex a set of MAP decoding units in different standards, use the parallel processing method, and perform the MAP iterative decoding processing on the to-be-decoded data in accordance with the standard types.

Wherein, the MAP iterative decoding processing comprises iterations of the MAP1 processing and the MAP2 processing.

In the present embodiment, according to different standards, different parallel processing methods are taken. In the LTE and WiMAX standards, a multi-PU parallel decoding method is used. Within the PU, it is divided into a plurality of windows, and one window is processed after another.

In the UMTS and TD-SCDMA standards, only a single PU decoding method can be used; within the PU, the serial processing method in which one window is processed after another is used.

Figure 4:
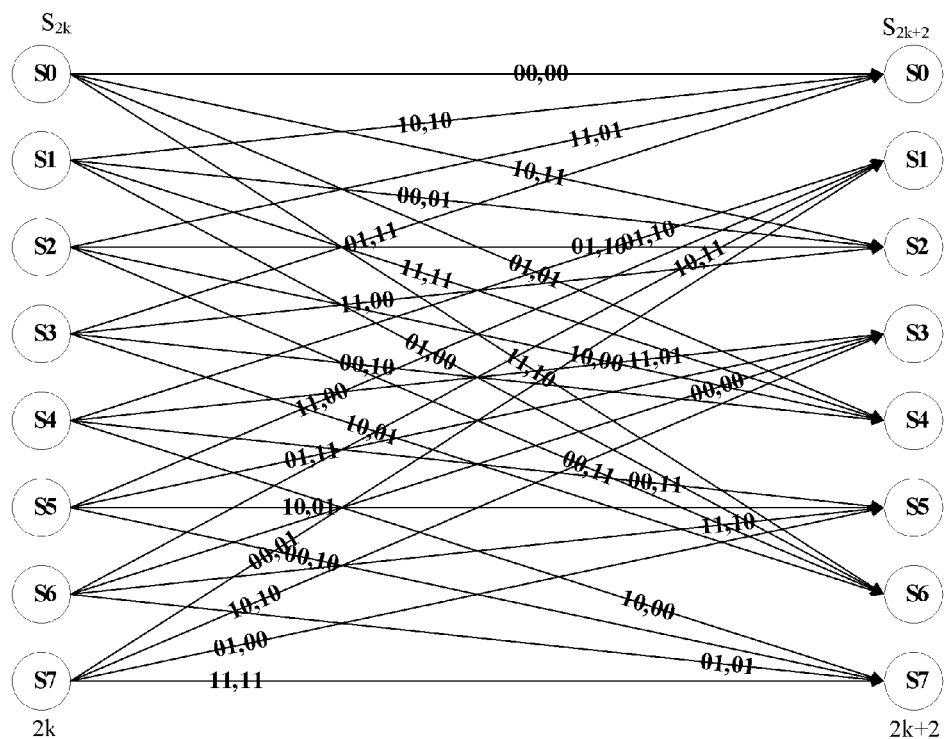
FIG. 4 is the state transition diagram of a 3GPP Turbo Decoder when using the Radix-4 in the multi-mode decoder implementation method in accordance with an embodiment of the present invention.
Figure 5:
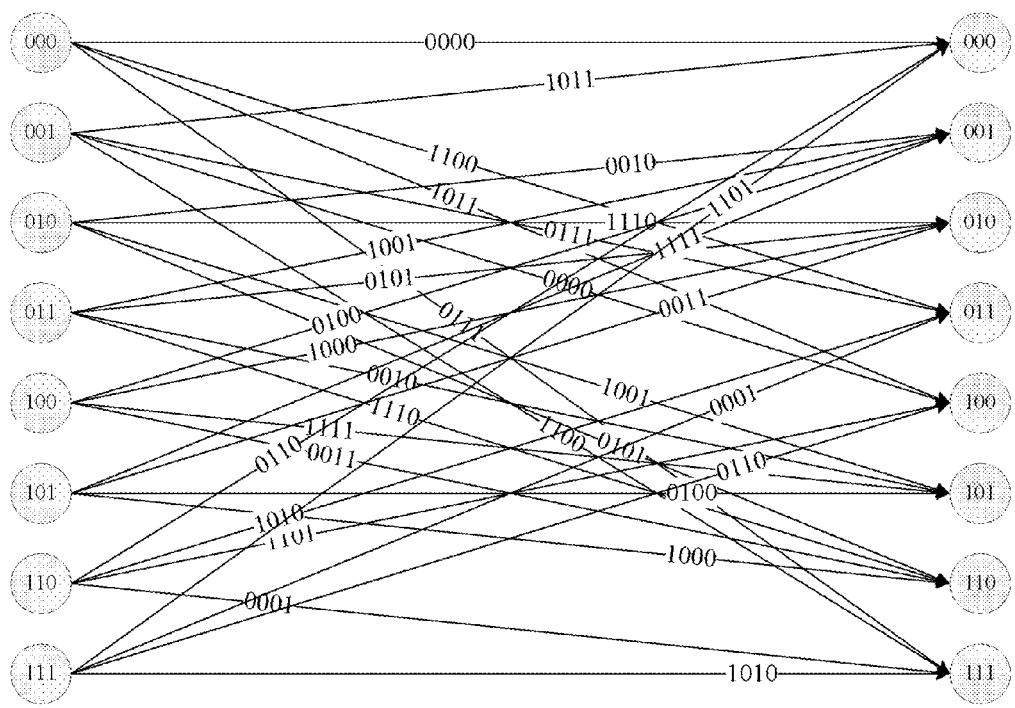
FIG. 5 is the state transition diagram of a WiMAX Turbo Decoder when using the Radix-4 in the multi-mode decoder implementation method in accordance with an embodiment of the present invention.

When processing each window, a variety of standards multiplex one set of Radix-4 MAP decoding units. But the intermediate variable calculation formula of the MAP decoding unit in the WiMAX standard is different (state transition diagrams of Alpha and Beta are different) from those of the MAP decoding units in other standards, as shown in FIG. 4 and FIG. 5, wherein FIG. 4 is the state transition diagram of a 3GPP Turbo decoder when using the Radix-4 in accordance with the present embodiment; FIG. 5 is the state transition diagram of a WiMAX Turbo decoder when using the Radix-4 in accordance with the present embodiment.

Figure 6:
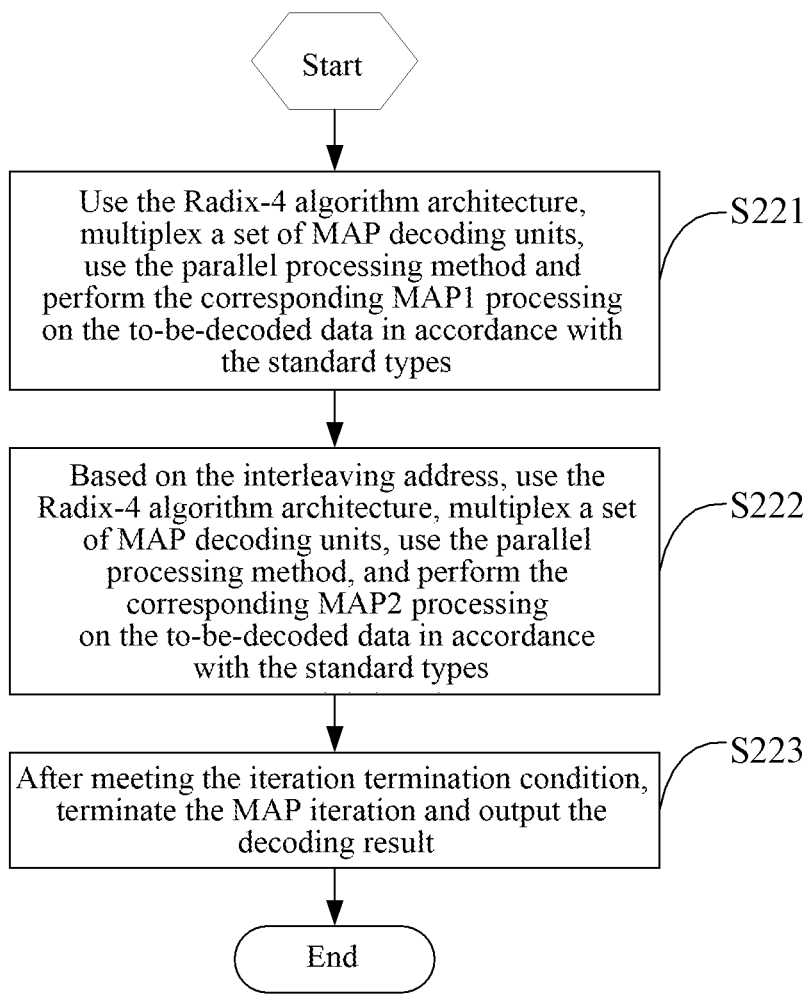
FIG. 6 is a flow chart of based on the interleaving address, using the Radix-4 algorithm architecture, multiplexing a set of MAP decoding units, using a parallel processing method, and performing a corresponding MAP iterative decoding processing on the to-be-decoded data in accordance with the standard types in the multimode decoder implementation method in accordance with an embodiment of the present invention.

As shown in FIG. 6, the step S22 comprises:

in S221, it is to use the Radix-4 algorithm architecture, multiplex a set of MAP decoding units, use the parallel processing method and perform the MAP1 processing on the to-be-decoded data in accordance with the standard types.

During the MAP1 processing, it is to use the forward Alpha and backward Beta collision computing method, use idle RAMs, back up an additional copy of system bits and priori information, to address the problem that 4 data are read and calculated at the same time of the MAP2 processing in the UMTS and TD-SCDMA standards.

In S222, based on the interleaving address, it is to use the Radix-4 algorithm architecture, multiplex a set of MAP decoding units, use the parallel processing method, and perform the MAP2 processing on the to-be-decoded data in accordance with the standard types.

During the MAP2 processing, after a collision, it is to back up two of the four calculated hard judgment results and prior information, together with the interleaving address, and then write it back in the next window.

In S223, after meeting the iteration termination condition, it is to terminate the MAP iteration and output the decoding result.

After completing one iteration (the MAP1 processing and the MAP2 processing), on the premise of meeting the minimum number of iterations, according to a certain early iteration termination criterion (such as, whether the hard judgment result is equal to the previous result or not, or whether the cyclic redundancy check (CRC) is correct or not, and so on) to determine whether to terminate the iteration in advance or not.

After meeting the iteration termination condition, it is to terminate the MAP iteration and output the decoding result.

Furthermore, take one set of MAP decoding unit comprising four MAP decoding units for example, the procedure of the present embodiment performing the MAP1 decoding on the to-be-decoded data in different standards is:

in the LTE standard and the WiMAX standard, after all the to-be-decoded data are stored, enabling the decoder. In order not to affect the decoding performance, four MAP decoding units are used for parallel processing (the processing capability is equivalent to 8 channels in Radix-2). And the forward Alpha and backward Beta collision computing method is used to reduce the decoding delay. One MAP decoding unit is multiplexed in different standards. Under different standards, the processing procedures of the MAP decoding unit are similar, but only the formulas for computing Gamma, Alpha and Beta are different.

In the LTE standard and the WiMAX standard, in order to avoid the conflict of the reading and writing data after the collision (simultaneously reading 2 numbers from and writing 2 numbers into a priori information storage RAM), before the collision, at the same time of reading the priori information for the MAP calculation, the priori information of the sliding window length is buffered according to an order. After the collision, the priori information is read from the buffer and is used to calculate, and the calculated priori information is stored in the priori information storage RAM, so there will be no conflict.

In the UMTS and TD-SCDMA standards, due to the random distribution characteristic of interleaving address, in order to perform the MAP2 processing within the same window, four data are read simultaneously according to the interleaving address, some of the data are backed up. The system information is backed up when calculating the Gamma (multiplex the llr_sys storage RAM in the LTE standard). 2 copies of the calculated prior information are backed up (multiplex the llr_check1 and the llr_check2 in the LTE standard).

In the MAP1 processing, only if one window has been processed, the next window will be processed. When all the windows in the PU have been processed, the MAP2 processing will be started.

The process of the present embodiment performing the MAP2 decoding processing on the to-be-decoded data in different standards is as follows:

the MAP2 processing and the MAP1 processing share one set of MAP decoding units. During the MAP2 processing, the interleaving processing is performed on the input data.

In the LTE standard and the WiMAX standard, the interleaving characteristic determines that interleaving addresses of the parallel processing data are just distributed in different processing units. Thus, the MAP2 processing is similar to the MAP1, and no further special processing is required.

When performing the MAP2 processing in the UMTS standard and the TD-SCDMA standard, during the Alpha and Beta collision calculation, it needs to read 4 system bits/check bit 2/priori information simultaneously from the storage RAM. Because the interleaving addresses of these four data are randomly distributed, there is a lot of randomness, and it is possible that no matter how many RAMs are used for storage, it cannot solve the needs of reading four numbers (the RAM has up to two reading ports) at a time. Because in the MAP1 processing, 2 copies of system bits and priori information have already been stored (when the check bit 2 is in the MAP2, it is read according to the original address, and there is no need to store 2 copies), therefore, during the reading, two of them are read from the RAM before the backup, and the other two of them are read from the RAM after the backup, thereby solving the requirements of reading four data simultaneously.

In the UMTS standard and the TD-SCDMA standard, during the MAP2 processing, four priori information/hard judgments calculated after the collision are simultaneously stored into the RAM (the storage address is randomly distributed and has a lot of randomness). To solve this problem, two of the four priori information and hard judgment data generated after the collision, together with the interleaving address, are stored in a Buffer (ut_apri_sw) whose depth is equal to the window length. Once the calculation in the next window starts, the data stored in the Buffer are stored in the priori information and hard judgment storage RAM in accordance with the corresponding interleaving address. It should be noted that after completing the MAP2 calculation of the last window, it needs the delay of half the window length to store data in the Buffer into the RAM, then the MAP1 calculation of the next iteration starts.

After completing one MAP1 processing and MAP2 processing, it needs to judge whether to terminate the iteration or not. According to the termination iteration type (for example, whether the hard judgment results of two consecutive iterations are equal or not, or the CRC is correct or not, etc.), it is to judge whether the iteration termination condition is met or not. If the condition is met, it is to immediately stop decoding, and if the condition is not met, return to the step of interleaving address calculation according to the number of iterations until it reaches the maximum number of iterations, and then output the decoding result.

It should be noted that with the architecture of the present embodiment, it must guarantee that the Radix-4 Max-Log-MAP algorithm is supported in algorithm in different standards. In addition, it must also support the WiMAX standard.

The present embodiment is based on the standards of LTE, UMTS, TD-SCDMA and WiMAX, but the described method may be applied to other standards (such as Global System for Mobile Communications (GSM) and CDMA2000) depending on the situation. As long as resources can be shared among different standards, it can be applicable to the situation of reducing system resources (especially RAM).

Compared with the existing Turbo decoders, the present embodiment has the following feature:

1) support the Turbo decoding function in a variety of standards such as LTE, UMTS, TD-SCDMA and WiMAX;

2) all standards unifiedly use the Radix-4 algorithm architecture, which is helpful to reducing the decoding delay.

3) optimize the RAM resources through the RAM multiplexing among different standards, thereby reducing power consumption and area.

4) in the LTE standard, 3 groups of soft information can be output to support the Turbo-SIC function of the link.

Through the abovementioned solution, the present embodiment can multiplex and share the resources, and achieve the Turbo decoding function under a variety of standards such as LTE, UMTS, TD-SCDMA and WiMAX with fewer resources. Compared with traditional single-standard decoder, it saves more than 30% RAM resources and reduces the power consumption.

Figure 7:
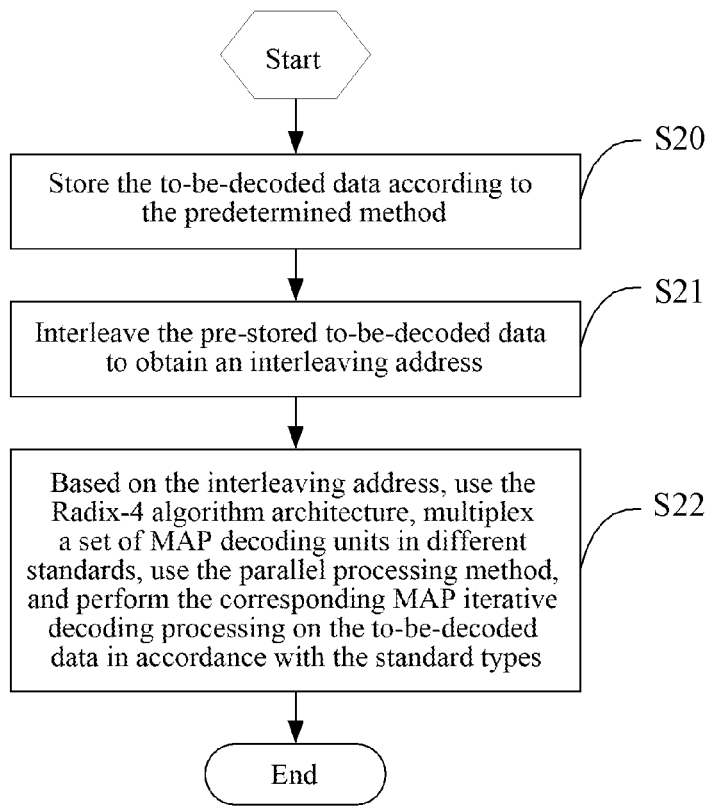
FIG. 7 is a flow chart of the multi-mode decoder implementation method in accordance with another embodiment of the present invention.

As shown in FIG. 7, in a multi-mode decoder implementation method provided in another embodiment of the present invention, it further comprises the following step before the step S21:

in step S20, it is to store the to-be-decoded data according to the predetermined method.

The difference between the present embodiment and the abovementioned embodiment is that the present embodiment may also achieve storing the to-be-decoded data in a particular way, and the storage procedure comprises:

in the LTE standard, the input to-be-decoded data (system bits, check 1 and check 2), according to the PUs where they are located, are respectively stored in four groups of corresponding RAMs with a depth of 1536; wherein, each group of RAMs with the depth of 1536 is composed of two RAMs with a depth of 768, which respectively store the to-be-decoded data of each PU according to the even and odd addresses of each group.

In the UMTS standard and the TD-SCDMA standard, because the multi-PU parallel decoding is not supported, only the data with the even and odd addresses are separated during the storage, and according to the length of code block, the method is used that one group of RAMs with a depth of 1536 is filled up firstly and then the next group of RAMs with a depth of 1536 will be used to store the data, and each group comprises two RAMs with a depth of 768, which respectively correspond to data with the odd address and data with the even address. In the UMTS and the TD-SCDMA, except that the fourth group of RAMs with a depth of 1536 is not filled up, the first three groups of RAMs with a depth of 1536 are filled up with the input to-be-decoded data of data pairs.

Figure 8:
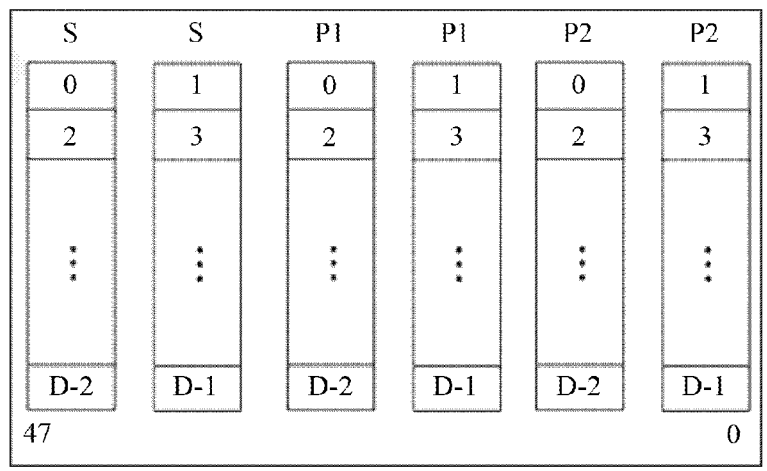
FIG. 8 is a schematic diagram of a LTE/UMTS/TD-SCDMA input data buffer format in the multi-mode decoder implementation method in accordance with another embodiment of the present invention.

The LTE/UMTS/TD-SCDMA input data buffer format is as shown in FIG. 8.

In the WiMAX standard, 600 bit pairs respectively corresponding to the A/B, Y, W of each channel of to-be-decoded data are respectively stored into the corresponding 2 RAMs with a depth of 768 within the RAM with a depth of 1536.

The WiMAX input data buffer format is as shown in FIG. 9.

The present embodiment uses few resources to achieve the Turbo decoding function under a variety of standards such as LTE, UMTS, TD-SCDMA and WiMAX by using the resource multiplexing and sharing; compared with traditional single-standard decoders, it saves more than 30% of RAM resources and reduces power consumption.

As shown in FIG. 10, the embodiment of the present invention provides a multi-mode decoder implementation device, comprising: an interleaving module 101 and a decoding module 102, wherein:

the interleaving module 101 is used to interleave the pre-stored to-be-decoded data to obtain an interleaving address; and the decoding module 102 is used to: based on the interleaving address, use a Radix-4 algorithm architecture, multiplex a set of maximum a posterior (MAP) decoding units in different standards, use a parallel processing method, and perform the MAP iterative decoding processing on the to-be-decoded data according to the standard types.

The multimode decoder implementation device in the present embodiment is a Turbo decoder which can be compatible with a variety of standards such as LTE, UMTS, TD-SCDMA and WiMAX, and it can solve the problem of resources sharing among different standards.

The internal system block diagram of the multimode Turbo decoder is shown in FIG. 3. Wherein:

the data_in module is responsible for shaking hands with external modules, receiving the decoding parameters, and dividing the decoded data into several channels in accordance with certain requirements.

The interleaver module is responsible for computing interleaving addresses of several standards. The max_log_map module is responsible for completing the Radix-4 MAP algorithm. The interleaver module is included in the interleaver module 101 in accordance with the present embodiment.

The data_out module, according to specific requirements, is responsible for outputting hard judgment data and soft information (when the LTE supports the Turbo-SIC scene).

The main_ctrl module is responsible for controlling the decoders in different standards to ensure that the decoders complete the MAP algorithm in accordance with their own processing procedures.

The sysbit/check1/check2 module stores the information bits of each PU respectively according to the method for storing information bits with the even and odd addresses separately.

The apri module is responsible for storing the apri in the LTE and WiMAX (there is no apri_11 in the WiMAX); in the UMTS and TD-SCDMA, this part is used to store the priori information obtained from the MAP2 calculation.

The apri_sw module is used for backing up the priori information of one window length before the Alpha and Beta collision in every window in the LTE and WiMAX standards.

The llr_sys module stores the output system log likelihood ratio (LLR) in the LTE; in the WiMAX, it stores the apri_11 obtained from each MAP (including MAP1 and MAP2) calculation and the apri_11 of each window; in the UMTS and the TD-SCDMA, it backs up the entire system bits.

The llr_check1 module stores the output LLR of the check1 in the LTE; and it is responsible for backing up a copy of the priori information obtained from the MAP1 calculation in the UMTS or the TD-SCDMA.

The llr_check2 module stores the output LLR of the check 2 in the LTE; and it is responsible for backing up a copy of the priori information obtained from the MAP1 calculation in the UMTS or the TD-SCDMA.

The ut_apri_sw module is used for backing up the priori information, hard judgment result and interleaving address of one window before the collision of Alpha and Beta of the MAP2 in the UMTS and the TD-SCDMA.

The abovementioned data_out module, main_ctrl module, sysbit/check1/check2 module, apri module, apri_sw module, llr_sys module, llr_check1 module, llr_check2 module and ut_apri_sw module are included in the decoding module 102 in the present embodiment.

Next, the processing procedure of the Radix-4 multimode Turbo decoder in the present embodiment will be described in detail.

In the LTE standard, take the maximum code block of 6144 being divided into four PUs, and each PU being divided into four 192 window serial processing as an example; in the UMTS standard and the TD-SCDMA standard, take the maximum code block of 5114 using 128 as the maximum window serial processing as an example; in the WiMAX standard, take the maximum FEC blocks of 4800 being divided into four PUs and each PU being divided into four 150 window serial processing as an example.

The method in accordance with the embodiment of the present invention comprises perform iteration on the to-be-decoded data for several times, and each iteration comprises the MAP1 and MAP2 processing procedures, the MAP1 input data is based on the sequential address, and the MAP2 input data is based on the interleaving address. Interleaving the to-be-decoded data in the embodiment of the present invention is to provide an interleaving addresses for the MAP2 processing. Wherein, the interleaving process may be performed at the same time of the MAP1 processing procedure, or before or after the MAP1 processing procedure, and the present embodiment takes performing the interleaving address calculation before the MAP1 processing as an example.

First, the interleaving module 101 performs interleaving calculation on the to-be-decoded data pre-stored in a specific method to obtain the interleaving address.

During the data storage, the data are stored according to a certain way, for example, in the LTE standard and the WiMAX standard, various PUs are stored independently, and in each PU, the data with odd and even addresses are stored separately; in the UMTS standard and the TD-SCDMA standard, only the data with odd and even addresses are stored separately. After the first group of RAMs is filled up, then the data will be stored in the next group of RAMs.

When calculating the interleaving address, the interleaving address is calculated according to the original addresses of the two input bit pairs (corresponding to four original addresses in the 3GPP standard). The interleaving units of different standards are different, but the external interfaces of the modules are the same.

Thereafter, through the decoding module 102, the MAP iterative decoding processing is performed on the to-be-decoded data according to the standard types.

Wherein, the MAP iterative decoding processing comprises iterations of the MAP1 processing and the MAP2 processing.

In the present embodiment, according to different standards, different parallel processing methods are taken. In the LTE standard and the WiMAX standard, a multi-PU parallel decoding method is used. Within the PU, it is divided into a plurality of windows, and one window is processed after another.

In the UMTS standard and the TD-SCDMA standard, only the single PU decoding method can be taken; in the PU, the serial method in which one window is processed after another is used.

When processing each window, a variety of standards multiplex one set of Radix-4 MAP decoding units. But the intermediate variable calculation formulas of the MAP decoding units of the WiMAX standard and other standards are different (the state transition diagrams of Alpha and Beta are different), as shown in FIG. 4 and FIG. 5, FIG. 4 is the state transition diagram of the 3GPP Turbo decoder when using the Radix-4 in the present embodiment; FIG. 5 is the state transition diagram of the WiMAX Turbo decoder when using the Radix-4 in the present embodiment.

As shown in FIG. 11, the decoding module 102 comprises: a MAP1 processing unit 1021, a MAP2 processing unit 1022 and a decoding result outputting unit 1023, wherein:

the MAP1 processing unit 1021 is used to: use a Radix-4 algorithm architecture, multiplex a set of MAP decoding units, use a parallel processing method, and perform a MAP1 processing on the to-be-decoded data in accordance with the standard types;

the MAP2 processing unit 1022 is used to: based on the interleaving address, use a Radix-4 algorithm architecture, multiplex a set of MAP decoding units, use a parallel processing method, and perform a MAP2 processing on the to-be-decoded data in accordance with the standard types; and the decoding result outputting unit 1023 is configured to: after meeting the iteration termination condition, terminate the MAP iteration and output a decoding result.

During the MAP1 processing, the forward Alpha and backward Beta collision computing method is used, and idle RAMs are used to back up an copy of system bits and priori information, to address the problem that in the UMTS and TD-SCDMA standards, 4 data are read and calculated at the same time during the MAP2 processing.

During the MAP2 processing, after a collision, two of the four calculated hard judgment results and priori information, together with the interleaving address, are backed up, and then written back in the next window.

After completing one iteration (the MAP1 processing and the MAP2 processing), on the premise of meeting the minimum number of iterations, according to a certain early iteration termination criterion (such as, whether the hard judgment result is equal to the previous result or not, or whether the cyclic redundancy check (CRC) is correct or not, etc.), it is to judge whether to terminate the iteration in advance or not.

After meeting the iteration termination condition, it is to terminate the MAP iteration and output the decoding result.

Furthermore, take one set of MAP decoding units comprising four MAP decoding units for example, the procedure of the present embodiment performing the MAP1 decoding processing on the to-be-decoded data in different standards is:

In the LTE standard and the WiMAX standard, after all the to-be-decoded data are stored, it is to enable the decoder. In order not to affect the decoding performance, four MAP decoding units are used for parallel processing (the processing capability is equivalent to 8 channels in Radix-2). And the forward Alpha and backward Beta collision computing method is used to reduce the decoding delay. One MAP decoding unit is multiplexed in different standards. Under different standards, the processing procedures of the MAP decoding unit are similar, and only the formulas for calculating Gamma, Alpha and Beta are different.

In the LTE standard and the WiMAX standard, in order to avoid the conflict of the reading and writing data after the collision (simultaneously reading 2 numbers from and writing 2 numbers into a priori information storage RAM), before the collision, at the same time of reading the priori information for the MAP calculation, it is to buffer the priori information of the sliding window length according to an order. After the collision, the priori information is read from the buffer and is used for the calculation, and the calculated priori information is stored in the priori information storage RAM, so there will be no conflict.

In the UMTS and TD-SCDMA standards, due to the random distribution characteristic of the interleaving address, in order to perform the MAP2 processing within the same window, four data are read simultaneously according to the interleaving address, and some of the data are backed up. The system information is backed up at the same time when calculating Gamma (multiplex the llr sys storage RAM in the LTE standard). It is to back up 2 copies of the calculated priori information (multiplex the llr_check1 and llr_check2 in the LTE standard).

In the MAP1 processing, only if one window has been processed, the next window will be processed. Only after all the windows in the PU have been processed, the MAP2 processing will be started.

The process of the present embodiment performing the MAP2 decoding processing on the to-be-decoded data in different standards is as follows:

the MAP2 processing and the MAP1 processing share one set of MAP decoding units. During the MAP2 processing, the interleaving processing is performed on the input data.

In the LTE standard and the WiMAX standard, the interleaving characteristic determines that interleaving addresses of the parallel processing data are just distributed in different processing units. Thus, the MAP2 processing is similar to the MAP1, and no further special processing is required.

When performing the MAP2 processing in the UMTS standard and the TD-SCDMA standard, during the Alpha and Beta collision calculation, it needs to read four system bits/check bit 2/prior information simultaneously from the storage RAM. Since the interleaving addresses of these four data are randomly distributed, there is a lot of randomness, and it is possible that no matter how many RAMs are used for storage, it cannot solve the need of reading four numbers at a time (the RAM has up to two reading ports). Because in the MAP1 processing, 2 copies of the system bits and priori information have already been stored (when the check bit 2 is in the MAP2, read the check bit 2 according to the original address, and there is no need to store 2 copies), therefore, during the reading, two of them are read from the RAM before the backup, and the other two of them are read from the RAM after the backup, thereby solving the need of reading four data simultaneously.

In the UMTS standard and the TD-SCDMA standard, during the MAP2 processing, four priori information/hard judgments calculated after the collision are simultaneously stored into the RAM (the storage address is randomly distributed and has a lot of randomness). To solve this problem, two of the four priori information and hard judgment data generated after the collision, together with the interleaving address, are stored in a Buffer (ut_apri_sw) whose depth is equal to the window length. Once calculation in the next window starts, the data stored in the Buffer are stored in the priori information and hard judgment storage RAM according to the interleaving address. It should be noted that after completing the MAP2 calculation of the last window, it needs the delay of half the window length to store data in the Buffer into the RAM, and then the MAP1 calculation of the next iteration starts.

After completing one MAP1 processing and MAP2 processing, it needs to judge whether to terminate the iteration or not. According to the termination iteration type (for example, whether the hard judgment results of two consecutive iterations are equal or not, or whether the CRC is correct or not, etc.), it is to judge whether the iteration termination condition is met or not. If the condition is met, it is to immediately stop decoding, and if the condition is not met, return to the step of interleaving address calculation according to the number of iterations until it reaches the maximum number of iterations, and then output the decoding result.

It should be noted that with the architecture of the present document, it must guarantee that the Radix-4 Max-Log-MAP algorithm is supported in algorithm in different standards. In addition, it must also support the WiMAX standard.

The present embodiment is based on the LTE, UMTS, TD-SCDMA and WiMAX standards, but the described method may be applied to other standards (such as Global System for Mobile Communications (GSM) and CDMA2000) depending on the situation. As long as resources are shared among different standards, it can be applicable to the situation of reducing system resources (especially RAM).

Compared with the existing Turbo decoders, the present embodiment has the following feature:

1) support the Turbo decoding function under a variety of standards such as LTE, UMTS, TD-SCDMA and WiMAX;

2) all standards unifiedly use the Radix-4 algorithm architecture, which is helpful to reducing the decoding delay.

3) optimize the RAM resources through the RAM multiplexing among different standards, thereby reducing power consumption and area.

4) in the LTE standard, 3 groups of soft information can be output to support the Turbo-SIC function of the link.

Through the abovementioned solution, the present embodiment can multiplex and share the resources, and achieve the Turbo decoding function under a variety of standards such as LTE, UMTS, TD-SCDMA and WiMAX with fewer resources. Compared with traditional single-standard decoder, it saves more than 30% RAM resources and reduces the power consumption.

Figure 12:
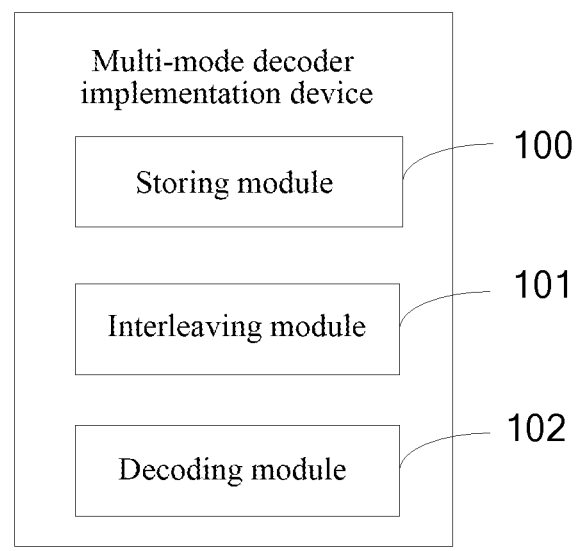
FIG. 12 is a schematic diagram of the structure of the multi-mode decoder implementation device in accordance with another embodiment of the present invention.

As shown in FIG. 12, another embodiment of the present invention provides a multimode decoder implementation device, and on the basis of the abovementioned embodiment, the device further comprises:

a storing module 100, which is used to store the to-be-decoded data according to a predetermined method;

the difference between the present embodiment and the abovementioned embodiment is that, the present embodiment further achieves storing the to-be-decoded data according to the specific method, and the storing process comprises:

in the LTE standard, respectively saving the input to-be-decoded data (system bits, check 1 and check 2) in four groups of corresponding RAMs with a depth of 1536 according to the processing units (PUs) where the to-be-decoded data are located; wherein, each group of RAMs with a depth of 1536 is composed of two RAMs with a depth of 768, and the to-be-decoded data of each PU are respectively stored according to the even and odd addresses of each group.

In the UMTS standard and the TD-SCDMA standard, because the multi-PU parallel decoding is not supported, only the data with even and odd addresses are separated during the storage, and according to the length of code block, the method of one group of RAMs with a depth of 1536 being filled up and then the next group of RAMs with a depth of 1536 being filled is used, and each group is composed of two RAMs with a depth of 768, which respectively correspond to data with the odd address and the even address. In the UMTS and the TD-SCDMA, except that the fourth group of RAMs with a depth of 1536 is not filled up, the first three groups of RAMs with a depth of 1536 are filled with the input to-be-decoded data of data pairs.

The LTE/UMTS/TD-SCDMA input data buffer format is as shown in FIG. 8. In the WiMAX standard, saving 600 bit pairs respectively corresponding to the A/B, Y, W of each channel of to-be-decoded data respectively into the corresponding two RAMs with a depth of 768 within the RAM with a depth of 1536.

The WiMAX input data buffer format is shown as FIG. 9.

The present embodiment uses few resources to achieve the Turbo decoding function under a variety of standards such as LTE, UMTS, TD-SCDMA and WiMAX by using the resource multiplexing and sharing; compared with traditional single-standard decoders, it saves more than 30% of RAM resources and reduces power consumption.

Those ordinarily skilled in the art can understand that all or some steps of the abovementioned method may be completed by the programs instructing the relevant hardware, and the abovementioned programs may be stored in a computer-readable storage medium, such as read only memory, magnetic or optical disk. Alternatively, all or part of the steps of the abovementioned embodiments may also be implemented by using one or more integrated circuits. Accordingly, each module/unit in the abovementioned embodiments may be realized in a form of hardware, or in a form of software function modules. The present document is not limited to any specific form of hardware and software combinations.

The above description is only preferred embodiments of the present invention and is not intended to limit the claims of the present document, any equivalent structures or equivalent process transformations made by using the specification and the accompanying figures of the present document, either directly or indirectly used in other relevant technology fields, should be within the patent protection scope of the present document.

INDUSTRIAL APPLICABILITY

The method and device provided in the embodiment of the present invention can be used to be compatible with a variety of standards such as LTE, UMTS, TD-SCDMA and WiMAX, thus making the system design more reasonable, and significantly saving the system logic resources; and greatly cutting some unnecessary RAM resources.

What is claimed is:

1. A multi-mode decoder implementation method, comprising:
   storing to-be-decoded data according to a predetermined method;
   performing an interleaving processing on the stored to be decoded data to obtain an interleaving address; and
   based on the interleaving address, using a Radix-4 algorithm architecture, multiplexing a set of maximum a posterior (MAP) decoding units in different standards, and using a parallel processing method to perform a MAP iterative decoding processing on the to-be-decoded data in accordance with standard types;
   wherein, said storing to-be-decoded data according to a predetermined method comprises:
   in the LTE standard, respectively storing input to-be-decoded data into four groups of RAMs with a depth of 1536 in accordance with processing units (PUs) where the to-be-decoded data are located; wherein each group of RAMs with the depth of 1536 is composed of two RAMs with the depth of 768, which respectively store to-be-decoded data of each PU according to even and odd addresses of each group;
   in the UMTS standard and the TD-SCDMA standard, for the input to-be-decoded data, according to the even and odd addresses of each group, in accordance with a length of code block, using a storing method that a group of RAMs with the depth of 1536 is filled up and then a next group of RAMs with the depth of 1536 is filled, wherein each group of RAMs with the depth of 1536 is composed of two RAMs with the depth of 768, and one RAM with the depth of 768 corresponds to data with the odd address, and the other RAM with the depth of 768 corresponds to data with the even address; and
   in the WiMAX standard, storing 600 bit pairs corresponding to A/B of each channel of to-be-decoded data into two RAMs with the depth of 768 within the RAM with the depth of 1536, storing 600 bit pairs corresponding to Y of each channel of to-be-decoded data into two RAMs with the depth of 768 within the RAM with the depth of 1536, and storing 600 bit pairs corresponding to W of each channel of to-be-decoded data into two RAMs with the depth of 768 within the RAM with the depth of 1536.

2. The method of claim 1, wherein said based on the interleaving address, using a Radix-4 algorithm architecture, multiplexing a set of MAP decoding units in different standards, and using a parallel processing method to perform a MAP iterative decoding processing on the to-be-decoded data in accordance with standard types comprises:
   using the Radix-4 algorithm architecture, multiplexing a set of MAP decoding units, using a parallel processing method and performing a MAP1 processing on the to-be-decoded data in accordance with the standard types;
   based on the interleaving address, using the Radix-4 algorithm architecture, multiplexing a set of MAP decoding units, using a parallel processing method, and performing a MAP2 processing on the to-be-decoded data in accordance with the standard types; and
   after meeting an iteration termination condition, terminating MAP iterations and outputting a decoding result.

3. The method of claim 2, wherein,
   the set of MAP decoding units comprises four MAP decoding units;
   said using the Radix-4 algorithm architecture, multiplexing a set of MAP decoding units, using a parallel processing method, and performing a MAP1 processing on the to-be-decoded data in accordance with the standard types comprises:
   in a Long Term Evolution (LTE) standard and Worldwide Interoperability for Microwave Access (WiMAX) standard, using four MAP decoding units for parallel processing, and using a forward Alpha and backward Beta collision computing method, before a collision, while reading priori information to perform a MAP calculation, sequentially buffering priori information of a sliding window length; after a collision, reading the priori information from a buffer for calculation, and saving priori information obtained from calculation into a priori information storage random access memory (RAM); and
   in a Universal Mobile Telecommunications System (UMTS) standard and time division-synchronous code division multiple address (TD-SCDMA) standard, when calculating Gamma, backing up system information at the same time.

4. The method of claim 2, wherein,
   the set of MAP decoding units comprises four MAP decoding units;
   said based on the interleaving address, using the Radix-4 algorithm architecture, multiplexing a MAP decoding unit, and using a parallel processing method and performing a MAP2 processing on the to-be-decoded data in accordance with the standard types comprises:
   in a LTE standard and WiMAX standard, based on the interleave address, using four MAP decoding units for parallel processing, and using a forward Alpha and backward Beta collision computing method, before a collision, while reading priori information to perform a MAP calculation, sequentially buffering priori information of a sliding window length; after a collision, reading the priori information from a buffer for calculation, and saving priori information obtained from calculation into a priori information storage RAM; and in a UMTS standard and TD-SCDMA standard, when performing an Alpha and Beta collision calculation, simultaneously reading 4 system bits/check bit 2/priori information from a storage RAM; and saving 4 priori information/hard judgments obtained from the collision calculation into the storage RAM at the same time.

5. A multi-mode decoder implementation device, comprising:

a storing module, which is configured to store to-be-decoded data according to a predetermined method;

an interleaving module, which is configured to: perform an interleaving processing on the stored to be decoded data to obtain an interleaving address; and a decoding module, which is configured to: based on the interleaving address, use a Radix-4 algorithm architecture, multiplex a set of maximum a posterior (MAP) decoding units in different standards, use a parallel processing method and perform a MAP iterative decoding processing on the to-be-decoded data in accordance with standard types;

wherein the storing module is configured to store to-be-decoded data according to a predetermined method in a following way:

in the LTE standard, respectively storing input to-be-decoded data into four groups of RAMs with a depth of 1536 in accordance with processing units (PUs) where the to-be-decoded data are located; wherein each group of RAM with the depth of 1536 is composed of two RAMs with the depth of 768, which respectively store to-be-decoded data of each PU according to even and odd addresses of each group;

in the UMTS standard and the TD-SCDMA standard, for the input to-be-decoded data, according to the even and odd addresses of each group, in accordance with a length of code block, using a storing method that a group of RAMs with the depth of 1536 is filled up and then a next group of RAMs with the depth of 1536 is filled, wherein each group of RAMs with the depth of 1536 is composed of two RAMs with the depth of 768, and one RAM with the depth of 768 corresponds to data with the odd address, and the other RAM with the depth of 768 corresponds to data with the even address; and in the WiMAX standard, storing 600 bit pairs corresponding to A/B of each channel of to-be-decoded data into two RAMs with the depth of 768 within the RAM with the depth of 1536, storing 600 bit pairs corresponding to Y of each channel of to-be-decoded data into two RAMs with the depth of 768 within the RAM with the depth of 1536, and storing 600 bit pairs corresponding to W of each channel of to-be-decoded data into two RAMs with the depth of 768 within the RAM with the depth of 1536.

6. The device of claim 5, wherein the decoding module comprises:

a MAP1 processing unit, which is configured to: use the Radix-4 algorithm architecture, multiplex a set of MAP decoding units, use a parallel processing method and perform a MAP1 processing on the to-be-decoded data in accordance with the standard types;

a MAP2 processing unit, which is configured to: based on the interleaving address, use the Radix-4 algorithm architecture, multiplex a set of MAP decoding units, use a parallel processing method, and perform a MAP2 processing on the to-be-decoded data in accordance with the standard types; and a decoding result outputting unit, which is configured to: after meeting an iteration termination condition, terminate MAP iterations and output a decoding result.

7. The device of claim 6, wherein, the set of MAP decoding units comprises four MAP decoding units;

the MAP1 processing unit is configured to use the Radix-4 algorithm architecture, multiplex a set of MAP decoding units, use a parallel processing method and perform a MAP1 processing on the to-be-decoded data in accordance with the standard types in a following way:

in a Long Term Evolution (LTE) standard and Worldwide Interoperability for Microwave Access (WiMAX) standard, using four MAP decoding units for parallel processing, and using a forward Alpha and backward Beta collision computing method, before a collision, while reading priori information to perform a MAP calculation, sequentially buffering priori information of a sliding window length; after a collision, reading the priori information from a buffer for calculation, and saving priori information obtained from calculation into a priori information storage random access memory (RAM); and in a Universal Mobile Telecommunications System (UMTS) standard and time division-synchronous code division multiple address (TD-SCDMA) standard, when calculating Gamma, backing up system information at the same time.

8. The device of claim 6, wherein, the set of MAP decoding unit comprises four MAP decoding units;

the MAP2 processing unit is configured to: based on the interleaving address, use the Radix-4 algorithm architecture, multiplex a set of MAP decoding units, use a parallel processing method, and perform a MAP2 processing on the to-be-decoded data in accordance with the standard types in a following way:

in a LTE standard and WiMAX standard, based on the interleave address, using four MAP decoding units for parallel processing, and using a forward Alpha and backward Beta collision computing method, before a collision, while reading priori information to perform a MAP calculation, sequentially buffering priori information of a sliding window length; after a collision, reading the priori information from a buffer for calculation, and saving priori information obtained from calculation into a priori information storage RAM; and in a UMTS standard and TD-SCDMA standard, when performing an Alpha and Beta collision calculation, simultaneously reading 4 system bits/check bit 2/priori information from a storage RAM; and saving 4 priori information/hard judgments obtained from the collision calculation into the storage RAM at the same time.

* * * * *